US008907473B2

(12) United States Patent
Crowder et al.

(10) Patent No.: US 8,907,473 B2
(45) Date of Patent: Dec. 9, 2014

(54) SEMICONDUCTOR DEVICE HAVING A DIAMOND SUBSTRATE HEAT SPREADER

(75) Inventors: Jeffrey Dale Crowder, Phoenix, AZ (US); Dave Rice, Chandler, AZ (US)

(73) Assignee: Estivation Properties LLC, Dover, DE (US)

( * ) Notice: Subject to any disclaimer, the term of this patent is extended or adjusted under 35 U.S.C. 154(b) by 1199 days.

(21) Appl. No.: 12/364,209

(22) Filed: Feb. 2, 2009

(65) Prior Publication Data
US 2010/0193943 A1    Aug. 5, 2010

(51) Int. Cl.
*H01L 23/06* (2006.01)
*H01L 23/047* (2006.01)
*H01L 23/373* (2006.01)

(52) U.S. Cl.
CPC ..... H01L 23/047 (2013.01); *H01L 2924/13091* (2013.01); *H01L 2924/01079* (2013.01); H01L 23/3732 (2013.01)
USPC .... 257/729; 257/713; 257/720; 257/E23.111; 438/125

(58) Field of Classification Search
CPC ............... H01L 23/37321; H01L 2924/01079; H01L 2924/13091
USPC .......... 257/709, 717, E23.111, 713, 720, 729; 438/125
See application file for complete search history.

(56) References Cited

U.S. PATENT DOCUMENTS

| 6,514,832 B1* | 2/2003 | Nakagawa et al. ........... 438/412 |
| 6,919,525 B2* | 7/2005 | Pinneo ...................... 219/121.38 |
| 2003/0026303 A1* | 2/2003 | Ouchi .............................. 372/36 |
| 2004/0108600 A1 | 6/2004 | Liang et al. |
| 2006/0226451 A1* | 10/2006 | Davies .......................... 257/210 |
| 2007/0272997 A1* | 11/2007 | Kobayashi et al. ........... 257/460 |
| 2008/0157347 A1* | 7/2008 | Takashima .................... 257/712 |

FOREIGN PATENT DOCUMENTS

| EP | 1439587 A1 | 7/2004 |
| JP | 2001024118 A | 1/2001 |
| JP | 2007180441 A | 7/2007 |
| WO | 2010088124 A3 | 10/2010 |

OTHER PUBLICATIONS

International Search Report and Written Opinion received for PCT patent Application No. PCT/US2010/021594, mailed on Aug. 27, 2010, 12 Pages.

* cited by examiner

*Primary Examiner* — Kimberly Rizkallah
*Assistant Examiner* — Maria Ligai

(57) ABSTRACT

In accordance with one or more embodiments, a semiconductor device comprises a semiconductor die having a heat region disposed on at least one portion of the semiconductor die, and a diamond substrate disposed proximate to the semiconductor die, wherein the diamond substrate is capable of dissipating heat from the diamond substrate via at least one or more bumps coupling the diamond substrate to the heat region of the semiconductor die.

15 Claims, 7 Drawing Sheets

US 8,907,473 B2

SEMICONDUCTOR DEVICE HAVING A DIAMOND SUBSTRATE HEAT SPREADER

TECHNICAL FIELD

The present disclosure generally relates to a semiconductor device, and more particularly relates to a transistor having a diamond heat spreader.

BACKGROUND

In general, a power transistor, and more particularly, a higher frequency power transistor may be designed for lower on-resistance, capacitance, and/or inductance. Transistors may be designed to operate over a wide variety of conditions depending on the application. In many applications, the transistor may be the limiting factor on the performance that can be obtained in a system. Also, the transistor may contribute significantly to the overall power dissipation and/or efficiency of the system.

Increasing transistor power density may be one path to increasing device performance. Increasing the power density of a transistor reduces the size involved to deliver a predetermined power level. Typically, reducing the physical dimensions of the transistor may result in a corresponding reduction in device parasitics. Higher switching frequencies, higher operating frequency, and/or wider bandwidth are examples of enhanced performance of the transistor. On-resistance per unit area also may decrease due to the increased packing density of transistors. Another result may be that the number of devices that can be manufactured on a wafer increases thereby reducing the cost of manufacture. However, increasing power density cannot be at the expense of device breakdown voltage and/or removing heat effectively away from the transistor.

BRIEF DESCRIPTION OF THE DRAWINGS

The disclosed subject matter will hereinafter be described in conjunction with the following drawing figures, wherein like numerals denote like elements, and wherein.

DETAILED DESCRIPTION

Figure 1:
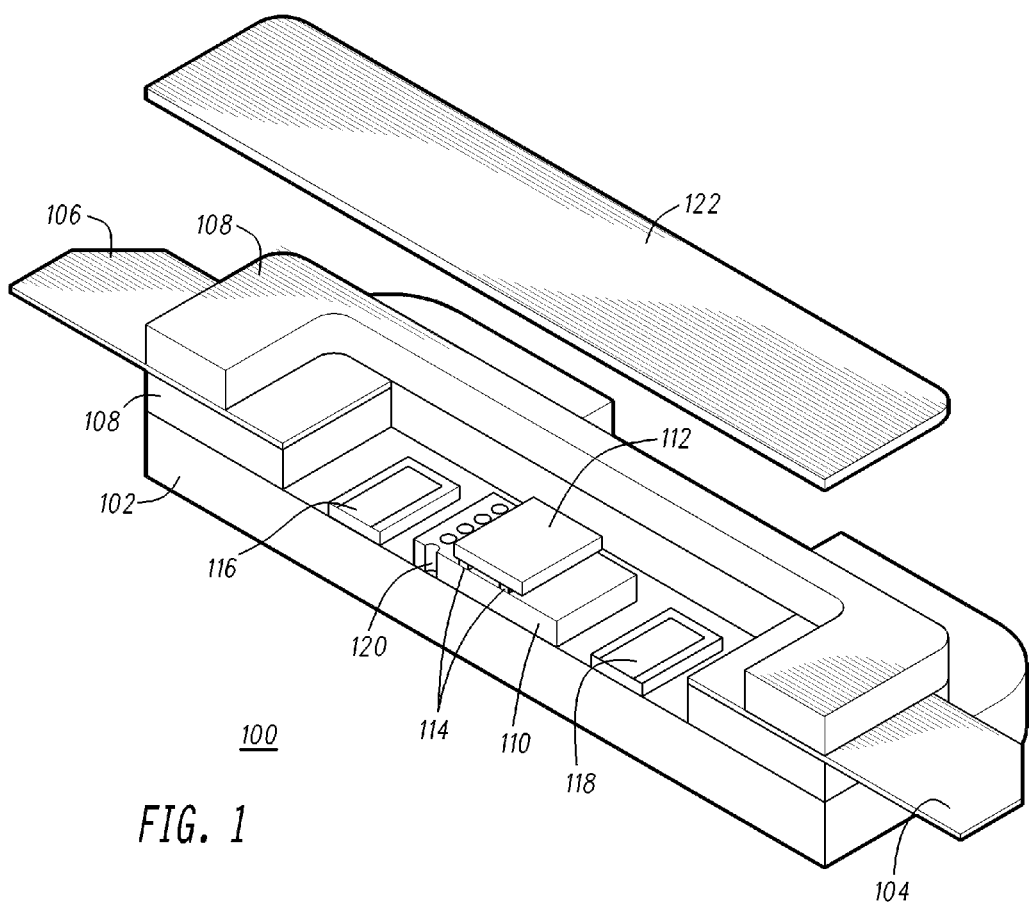
FIG. 1 is a cross-sectional view of a high frequency transistor in accordance with one or more embodiments.

The following detailed description is merely exemplary in nature and is not intended to limit the claimed subject matter or the application and uses thereof. Furthermore, there is no intention to be bound by any expressed or implied theory presented in the present detailed description.

In one or more of the example embodiments illustrated and discussed herein, any specific materials, temperatures, times, energies, and so on for wafer processes or specific structure implementations should be interpreted to be illustrative only and non-limiting. Processes, techniques, apparatus, and/or materials as known by one of ordinary skill in the art may not be discussed in detail but are intended to be part of an enabling description where appropriate.

Note that similar reference numerals and letters refer to similar items in the following figures. Furthermore, numbers from previous illustrations may not be placed on subsequent figures for purposes of clarity. In general, it may be assumed that structures not identified in a figure may be the same structures or elements appearing in one or more previous figures.

FIG. 1 is a cross-sectional view of a high frequency transistor 100 in accordance with one or more embodiments. In general, a transistor has a first electrode, a control electrode, and a second electrode. A bias voltage applied to the control electrode controls a channel region that couples the first electrode to the second electrode. The voltage magnitude applied to the control electrode corresponds to the current conducted by the transistor and is affected by other factors such as the voltage differential across the first and second electrodes and thermal considerations. The subject matter described herein is applicable to field effect transistors and devices operating at high power and high frequency.

A field effect transistor has a drain, a gate, and a source that corresponds respectively to a first electrode, a control electrode, and a second electrode. The gate overlies a channel region that couples the drain to the source. In an enhancement mode device, a conduction path between drain and source is formed when a voltage above a threshold voltage is applied to the gate. Conversely, in a depletion mode device, the conduction path exists between drain and source without a voltage being applied to the gate. A voltage applied to the gate enhances or reduces the conduction path. The subject matter described herein is applicable to enhancement and depletion mode field effect transistors.

A power transistor can be formed as one large transistor. For example, a field effect transistor having a single drain region, single gate, and a single source region. Similarly, a bipolar transistor having a single collector region, single base region, and a single emitter region. Alternately, a power transistor can be formed as more than one transistor such that the first electrodes are coupled in common, the control electrodes are coupled in common, and the second electrodes are coupled in common. In at least one exemplary embodiment of the power transistor, one of the electrodes is a single region which significantly increases the power density of the device. An example of this is a field effect transistor having a common drain region as a single region for all the transistor cells of the power transistor. The field effect transistor further includes more than one source region that are coupled in common and more than one gate that are coupled in common. In at least one exemplary embodiment, the transistor described herein is applicable to power transistors formed as a single large device or more than one transistor coupled in common.

In at least one exemplary embodiment, a n-channel MOSFET transistor is used to illustrate the claimed subject matter. As mentioned previously, the transistor can be other types of field effect transistors. The claimed subject matter is also not limited to an n-type device such as an n-channel transistor but encompasses other channel types including p-channel transistors. Furthermore, a cross-section of a partial transistor is used to illustrate the wafer process used to form a high performance transistor. The partial transistor can be scaled to form a single large transistor or a group of transistor cells coupled in parallel to form a larger device. For example, a group of fingered transistor cells or serpentine transistor cells can be formed having separate drain and source regions which are respectively coupled together (drain to drain/source to source) to form a larger device. Alternately, the group of transistor cells can be formed having a common region such as the drain or source. The example shown herein is a device structure having a common drain region. The common drain configuration is shown to illustrate a dense transistor structure suitable for a power transistor. It is well understood by one skilled in the art that separate drain structures can be formed to create more than one transistor that are independent from one another.

In one or more embodiments, high frequency transistor 100 comprises a flange 102, a lead 104, a lead 106, a non-conductive package ring 108, a heat spreader 110, a transistor die 112, and a package cap 122. Minimizing parasitic resistance, capacitance, and/or inductance of transistor 100 enables high frequency operation. At high power (typically greater than 5-10 watts) the transistor 100 may generate substantial heat to be removed, otherwise performance and reliability of the device may be compromised. Furthermore, the transistor 100 is housed in a package to protect the device from an ambient environment. The package is an integral part of the thermal path to remove heat from the die. The package adds parasitic resistance, capacitance, and inductance that degrade performance. An added factor is stress that is coupled to the transistor die through the physical connection to the package.

One path to higher frequency operation is to reduce device dimensions allowing a high transistor gate width/length ratio per unit area. Increasing device density places a significant challenge on maintaining the device temperature below a predetermined maximum temperature since more heat is generated in a given volume of semiconductor material. At higher frequencies the speed at which the heat can be removed, described herein as the thermal transient response of the device becomes an elevated issue to maximize device performance, ruggedness, and reliability.

In at least one or more embodiments, flange 102 is an electrical lead for power transistor 100. A non-conductive package ring 108 is formed on and connects to flange 102. Non-conductive package ring 108 comprises a non-electrically conductive material such as plastic or ceramic. Non-conductive package ring 108 is bonded or attached to flange 102. Non-conductive package ring 108 forms a sidewall of an enclosure bounded and sealed on one side by flange 102.

Lead 104 extends from a side of non-conductive package ring 108 to provide an external connection for power transistor 100. Lead 104 extends within the enclosure for coupling to the transistor die. Lead 104 is electrically isolated from contact to other components of the package by non-conductive package ring 108. Similarly, lead 106 extends from a side of non-conductive package ring 108 to provide an external connection. Lead 106 extends within the enclosure for coupling to the transistor die and is electrically isolated from contact to other components.

A cap 122 is attached to an exposed ring surface of non-conductive package ring 108 to seal the enclosure from the ambient environment. Non-conductive package ring 108 can be formed from machined components or using a molding process as is known to one skilled in the art.

In at least one exemplary embodiment, power transistor 100 has a gate, a drain, and a source. For example, a n-channel enhancement power MOSFET transistor is a device used for both high frequency switching applications and high frequency linear amplifiers and will be used hereinafter as a non-limiting example for illustrating improved performance, reduced stress, and better thermal characteristics. The gate, drain, and source of the n-channel transistor corresponding to die 112 are respectively coupled to lead 104, lead 106, and flange 102. In at least one exemplary embodiment, a gate and source contact region overlie a first surface of die 112. The drain contact region overlies a second surface of die 112. The heat generated by the device is removed from first surface of die 112 which is the processed side of the die. More specifically, the processed side of the die is where the active area of the transistor resides. The active area includes the channel region of the device. Thus, the heat is removed in close proximity to the channel region of the transistor thereby minimizing the length of the thermal path through the semiconductor material.

Bumps 114 form electrical and physical connections between die 112 and heat spreader 110. Bumps 114 connect a gate contact region of die 112 on the first surface to a gate contact region on heat spreader 110. Similarly, bumps 114 connect a source contact region of die 112 on the first surface of die 112 to a source contact region on heat spreader 110. Bumps 114 are the principal thermal conductive path for removing heat from die 112. Bumps 114 are all of substantially equal height. Bumps 114 suspend die 112 at a predetermined distance above heat spreader 110.

Heat spreader 110 is attached to a region of flange 102 that is within the enclosure of the package. In at least one or more embodiments, heat spreader 110 comprises diamond. Heat spreader 110 includes a patterned metal layer on a first and second surface for electrical and physical connection. In at least one or more embodiments, the source contact region on the first surface of heat spreader 110 couples to a metal layer on the second surface of heat spreader 110. For example, the connection of the source contact region of heat spreader 110 can be a plurality of plated thru hole vias 120 or the source contact region can be formed so it extends over the sidewalls of heat spreader 110 and connects to the metal layer on the second surface.

Diamond is an efficient conductor of heat having a thermal conductivity greater than 1000 W/m*C. The heat in the diamond substrate spreads rapidly both laterally and vertically into heat spreader 110. The heat is spread over the entire second surface of heat spreader 110 that is coupled to flange 102 having a substantially reduced thermal flux per unit area. Thus, the heat can be removed more efficiently. In at least one exemplary embodiment, flange 102 is coupled to a heat sink for removing heat. A fan blowing air over the heat sink or water cooling of the heat sink can further increase heat removal.

In at least one or more embodiments, a capacitor 116 and a capacitor 118 are coupled to flange 102 within the enclosure. Capacitors 116 and 118 are used to respectively form an output and input matching networking for transistor 100. The matching network may optimize the device for operation over a limited frequency range. The bandwidth limited device is typically used for linear and pulsed power amplifiers as is known to one skilled in the art. For example, capacitors 116 and 118 can be shunt capacitors in which one terminal is coupled to flange 102 which is the source of transistor 100 and the other terminal is exposed for forming a matching network. Wirebonds (not shown) are used to electrically connect lead 106 and lead 104 respectively to capacitor 118 and capacitor 116. The wirebonds may be precisely formed as an inductor that is part of the matching network. Wirebonds (not shown) connecting the gate contact region on the first surface of heat spreader 110 to capacitor 118 is part of the input matching network. Wirebonds (not shown) connecting the second surface of die 112 to capacitor 116 is part of the output matching network. The input and output matching network may be tuned for a specific frequency and bandwidth that defines the operation of transistor 100. Other different matching network configurations could also be formed as is well know by one skilled in the art. It should be noted that capacitors 116 and 118 would not be required in a switching application. Minimizing the input and output switching capacitance would be advantageous to device performance in using the device as a switch or in a switching amplifier application.

Figure 2:
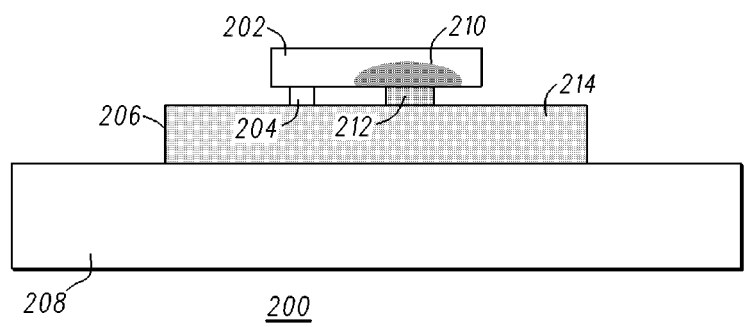
FIG. 2 is a cross-sectional view of a thermal path for the efficient removal of heat from a power transistor die in accordance with one or more embodiments.

FIG. 2 is a cross-sectional view of a thermal path for the efficient removal of heat from a power transistor die 202 in accordance with one or more embodiments. Heat from power transistor is removed from processed side of die 202. A region where the power transistor is formed is described as the active area of die 202. Metal used for interconnection in the wafer process contacts the semiconductor substrate in the active area forming a thermal pathway for removing heat from die 202. Heat generated by the transistor in proximity to the metal in contact with the semiconductor substrate flows from the substrate and through the metal. The metal in contact with the semiconductor substrate in the active area contacts a minority portion of the active area. A bump contact region overlies a majority portion of the active area that couples to the one or more metal connections to the semiconductor substrate. The combination of metal contact to semiconductor substrate connected to the bump contact region overlying provides a short and direct path for removing heat.

In at least one exemplary embodiment, the metal in contact with the semiconductor substrate disclosed hereinabove connects to a source region of the power transistor. The metal connection to the source region of the power transistor is both an electrical and thermal connection. Heat generated by the power transistor is indicated by region 210. It should be noted that heat is distributed throughout the resistive path through the drain region but the highest current density typically occurs near the surface where the current exits the channel region into the drain region. Region 210 is located in proximity to the active area of the power transistor. One or more metal bumps 212 contact the bump contact region on die 202 to transfer heat generated in region 210 from die 202 to diamond heat spreader 206. Bumps 212 which overlie and couple to the active area are the primary path for removing heat from die 202. One or more electrically isolated interconnections from die 202 can be made using bumps for connecting the electrodes of the power transistor to the package leads. Bumps 204 couple to the gate of the power transistor. Bumps 204 are an electrical connection from die 202 to metal interconnect on diamond heat spreader 206 and are a secondary path for heat removal.

In at least one exemplary embodiment, bumps 212 and bumps 204 are hard bumps. The hard bumps maintain their shape throughout the assembly process, thereby suspending die 202 above diamond heat spreader 206 by a predetermined distance. In at least one or more embodiments, the predetermined distance is suspended at a height that prevents arching that can occur due to the high operating voltage of the power transistor from the semiconductor substrate to the conductive layer on diamond heat spreader 206. The predetermined distance can also be adjusted to reduce parasitic capacitance between die 202 and the conductive surfaces of diamond heat spreader 206 which can increase significantly if underfill is used between die 202 and diamond heat spreader 206.

The thermal path from die 202 to diamond heat spreader 206 comprises die 202, bump 212, diamond heat spreader 206, flange 208, and a heat sink (not shown). Bump 212 (or bumps) transfers heat from the region 210 of die 202 to diamond heat spreader 206. The power transistor of die 202 is formed in region 210 so heat generated by the power transistor is in proximity to region 210. Diamond has an extremely high thermal conductivity (>1000 W/m*C). The heat delivered by bump 212 spreads throughout diamond heat spreader 206 producing a greatly reduced heat flux at the major surface coupled to flange 208. The dimensions of diamond heat spreader 206 are a tradeoff between cost and thermal capability, which will be discussed further herein below. Flange 208 is a thermal conductor typically comprising copper that is attached to a heat sink where the heat is removed from the system. Heat spreading in flange 208 further reduces the heat flux and thereby increases the efficiency of removal of heat. Simulations indicate a 30% improvement in thermal resistance when compared to die 202 directly attached to flange 208.

Figure 3A:
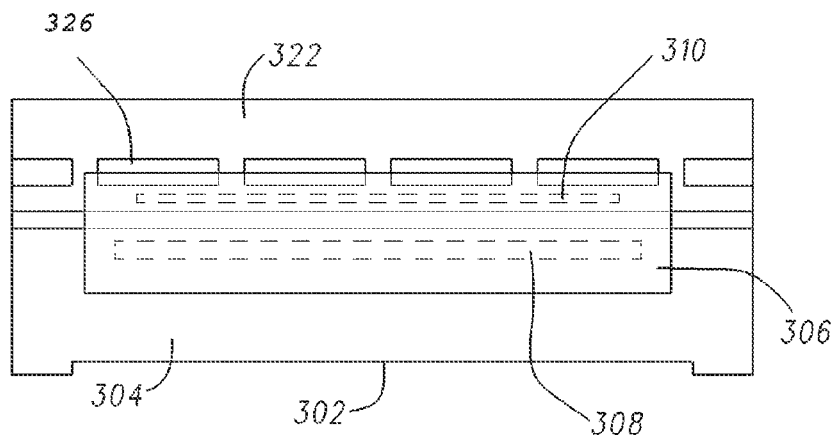
FIGS. 3A-3C are top views of a diamond substrate coupled to power transistors having different size active areas in accordance with one or more embodiments.
Figure 3B:
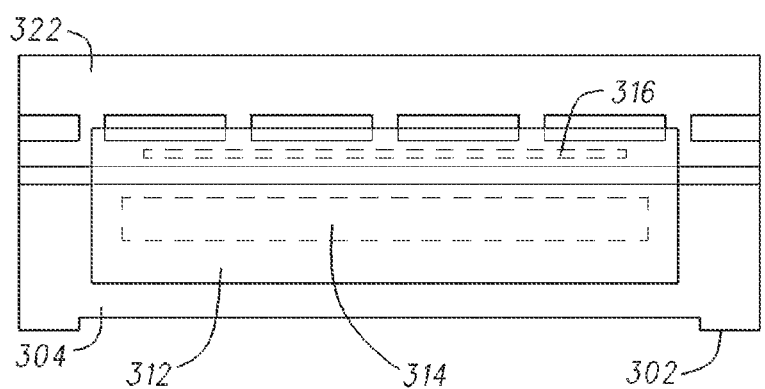
Figure 3C:
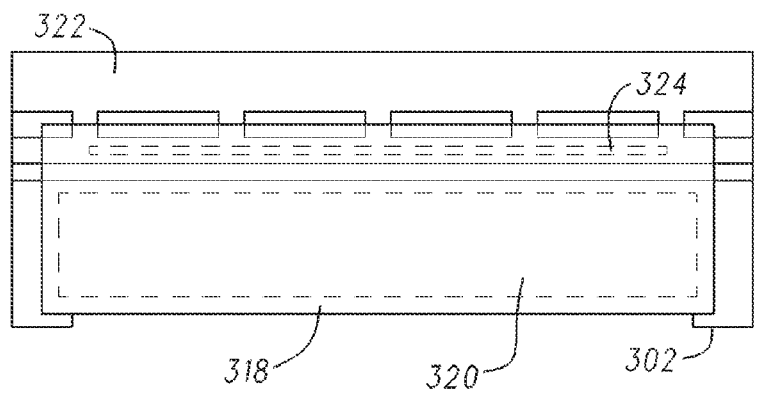

FIGS. 3A-3C are top views of a diamond heat spreader 302 coupled to power transistors having different size active areas in accordance with one or more embodiments. FIGS. 3A-3C each have diamond heat spreader 302 and respectively have a die 306, die 312, and die 318 attached thereto via bumps. Diamond heat spreader 302 is used in conjunction with a package allowing a standardized assembly process and a common package footprint to be offered for different power devices.

In at least one or more embodiments, two separate connections are made using bumps corresponding to a gate and a source connection of a power transistor. Diamond is a non-electrically conductive material. Diamond heat spreader 302 includes a patterned metal layer comprising a region 304 and a region 322 that respectively couple to the source and gate of the power transistor. Regions 304 and region 322 are physically separate from one another. Openings 326 reduce parasitic capacitance due to die 306, 312, and 318 overlying region 322. The reduced resistance of region 322 due to openings 326 may have little impact on device performance in driving the gate of the power transistor. Conversely, region 304 is a high current path for the power transistor and the resistance and inductance of the path is minimized.

Die 306, 312, and 318 of FIGS. 3A-3C respectively have a power rating from low to high with a corresponding change in die size from small to large. As mentioned previously, diamond heat spreader 302 is used with each die to simplify assembly and reduce cost. In at least one exemplary embodiment, the spacing between bumps on die 306, 312, and 318 are approximately the same. The similar bump spacing ensures each die can be consistently placed to contact the appropriate metal region on diamond heat spreader 302. Die 306 has bump 310 coupled to metal region 322 and bump 308 coupled to metal region 304. The surface of diamond heat spreader 302 is substantially planar. Bump 310 and bump 308 are formed substantially equal in height. Bump 308 overlies the active area of the power transistor to provide the shortest thermal path to diamond heat spreader 302. The short physical path of the source connection also minimizes device inductance thereby extending device frequency performance.

Die 312 has bump 316 coupled to metal region 322 and bump 314 coupled to metal region 304. Note that bump 314 comprises a larger area contacting metal region 304 than bump 308 corresponding to a larger power transistor. Die 312 has a similar area overlying metal region 322 but extends further over metal region 304 than die 306.

Die 318 may be the largest power transistor having the largest die area of the three die shown and may be designed for diamond heat spreader 302 thereby dissipating the most heat under maximum operating conditions. Die 318 has bump 324 coupled to metal region 322 and bump 320 coupled to metal region 304. Diamond heat spreader 302 is optimized to remove heat from die 318 to maintain a predetermined operating temperature in conjunction with other specified conditions such as a minimum heat sink to remove heat. As shown, bump 320 comprises the largest area when compared to bumps 308 and 314. The high thermal transfer capability of diamond allows the heat to spread efficiently throughout the diamond volume thereby reducing the heat flux at the second surface that is coupled to the flange (not shown). A bump is shown as a single contiguous bump structure for illustration purposes but they can be formed as multiple bumps that couple to diamond heat spreader 302.

Figure 4:
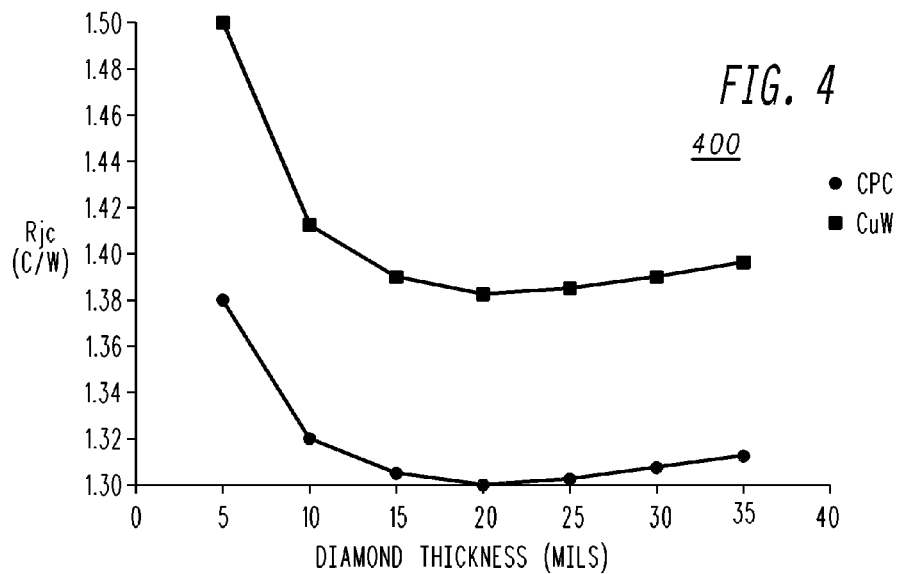
FIG. 4 is a graph illustrating thermal resistance versus diamond substrate thickness in accordance with one or more embodiments.

FIG. 4 is a graph 400 illustrating thermal resistance versus diamond substrate thickness in accordance with one or more embodiments. Two curves are shown for different flange materials to which the diamond substrate is coupled to. A first flange material is known as copper/copper molybdenum alloy/copper (CPC) comprising copper and molybdenum. The second flange material is comprises copper and tungsten. The simulation shows how thermal resistance varies with diamond substrate thickness where the width and length of the diamond substrate is held constant.

The diamond substrate in this example is designed for a 100 watt power transistor. The 100 watt power transistor has a bump for transferring heat from the die to the diamond substrate. A first surface of the diamond substrate has a metal layer for coupling to the bump. Similarly, a second surface of the diamond substrate has a metal layer for coupling to the flange. For the simulation the bump contacts the diamond substrate centrally on the first surface. The length and the width of the diamond substrate are similar to the shape and size of the power transistor die that will be discussed in more detail herein. The simulation shows that the CPC flange has a lower thermal resistance than the copper/tungsten flange for similar diamond thicknesses. The trend for each material is similar with both having their respective minimum thermal resistance at approximately 20 mils diamond thickness. The thermal resistance does not change significantly from 10 mils thickness to 35 mils thickness for each material. The high thermal conductivity of the diamond substrate through a substrate of at least 10 mils thick allows the heat to be spread effectively over the surface of the second major substrate thereby efficiently transferring heat to the flange.

There are several factors that may be involved in how the size of diamond substrate is selected. Factors such as cost, physical size, thermal constraints, stress, and/or assembly complexity may play a role in the dimensions of the diamond substrate. In general, higher frequency operation corresponds to more heat being generated in a smaller volume of semiconductor material. As such, thermal performance can be a limiting factor in the performance of the device. The minimum size of the diamond substrate may be dictated by the footprint required for the one or more bumps that couple to the diamond. The size of the diamond substrate can be increased to meet thermal specifications for maintaining the die at less than a maximum die temperature under all or nearly all operating conditions. Similarly, transient thermal performance under high frequency and high power transients can also be enhanced by modifying the dimensions of the diamond substrate, coupling the primary thermal path from the die (e.g., bumps) centrally to first surface of the diamond substrate, minimizing the thermal path through the semiconductor substrate to the bumps, and/or minimizing the bump height.

The diamond substrate of the simulation has a length and width greater than the length and width of the power transistor die. As disclosed hereinabove, having a diamond substrate designed to meet the thermal specifications of the largest power device for a package allows flexibility in assembly allowing the package to be used for die having different power levels. In at least one or more embodiments, the diamond substrate is made wider for interconnection purposes. The exposed metal layer of the diamond substrate allows for wire bonding, thru-hole plated vias or other connection methodologies to be used to couple to the power transistor using the patterned metal layer on the major surfaces of the diamond substrate.

Cost of the diamond substrate directly corresponds to the volume of diamond material used. For example, there may be a substantial change between the thermal resistance between 5 mils and 10 mils thick diamond substrates in the graph. Conversely, there may be only a minor change between 10 mils and 20 mils thickness. Thus, a 10 mils thick diamond substrate meets the thermal specification while minimizing cost. Moreover, in simulation there is greater than a 30% enhancement in thermal resistance when compared to a prior art approach using an interposer in the flange for gate interconnect and the thermal path bump from the die directly coupled to the flange.

Figure 5A:
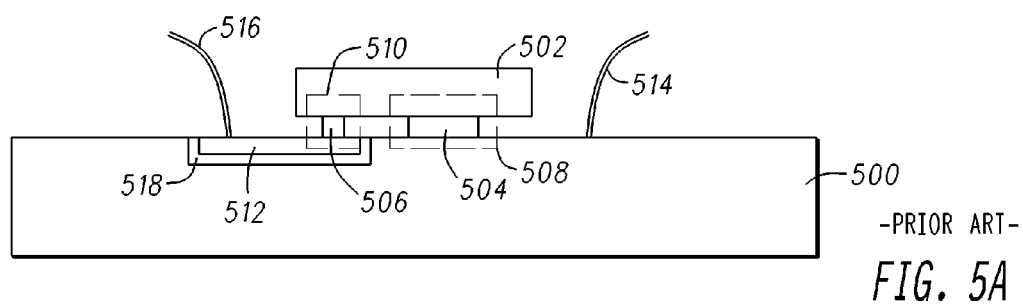
FIGS. 5A-5B are cross-sectional illustrations showing regions of stress on a transistor die respectively for a package in accordance with one or more embodiments.
Figure 5B:
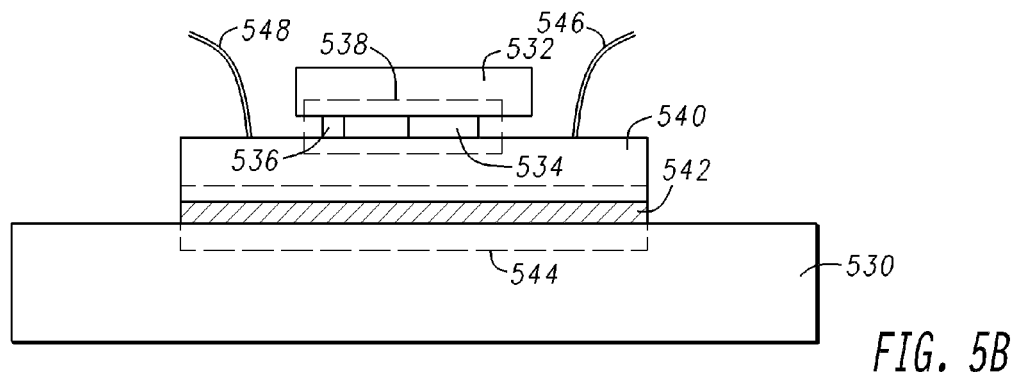

FIGS. 5A-5B are cross-sectional illustrations showing regions of stress on a transistor die respectively for a prior art package and a package in accordance with one or more embodiments. FIG. 5A is an illustration of a prior art package approach using an interposer 512 in a cavity of a flange 500. Interposer 512 has a patterned metal surface and typically comprises a non-conductive material such as ceramic. The exposed major surface of interposer 512 is made planar to the major surface of flange 500 during an assembly process. Interposer 512 is attached to flange 500 by an epoxy, metal preform, or other adhesive.

In at least one or more embodiments, power transistor 502 has two separate electrical connections. A bump 506 is an electrical connection from a gate of power transistor 502 to metal surface on interposer 512. A bump 504 is both a thermal and electrical conduction path. Bump 504 connects the source of power transistor 502 to flange 500. Heat from bump 504 spreads in flange 500 and is dissipated through an attached heat sink (not shown). Flange 500 is also a lead or terminal of the power transistor. In at least one or more embodiments, flange 500 comprises copper/molybdenum and/or copper/tungsten as is known by one skilled in the art.

The principal cause of stress on power transistor 502 is due to the different coefficient of temperature expansion (CTE) of the materials of the system. Three materials are connected together through bumps 504 and 506 each with a different CTE. The bump material itself would constitute a fourth material having a different CTE which further adds stress to the system but it is a second order effect. Interposer 512 comprises a ceramic material, power transistor 502 comprises a semiconductor material, and flange 500 comprises a metal composite. Bump 506 physically connects power transistor 502 to interposer 512. Bump 504 physically connects power transistor 502 to flange 500. Stress is induced as each material expands and contracts at different rates over the operating temperature range of power transistor 502. Two regions of high stress concentration are indicated. Region 510 is a region proximate to where bump 506 physically connects to power transistor 502 and to interposer 512. Region 508 is a region proximate to where bump 504 physically connects power transistor 502 and to flange 500. The material most prone to fracture or stress induced cracking is power transistor 502. Thus, the CTE mismatch of the three materials may be kept to a minimum to reduce stress.

Extra components may add to the complexity of manufacture and assembly of the package. A cavity is formed on the major surface of flange 500 to accept interposer 512. Interposer 512 is a custom component having a patterned metalized surface to receive bump 510. Interposer 512 requires an assembly process to ensure that the surface of interposer 512 is planar to the surface of flange 500. Attaching interposer 512 to flange 500 adds further materials that may be managed and increases assembly time of the package, which may increase the cost of manufacture.

Referring to 5B, a partial package is shown illustrating a method for reducing stress on power transistor 532 in accordance with one or more embodiments. The partial package comprises a flange 530, a diamond heat spreader 540, and power transistor 532. Flange 530 typically comprises a metal or metal composite and can be attached to a heat sink for removing heat from power transistor 532. Flange 530 comprises copper, copper/molybdenum composite, copper/tungsten composite, and/or other suitable material. In at least one or more embodiments, the copper/molybdenum composite and/or the copper/tungsten composite may be used in flange 530 as a compromise between thermal capability and minimizing CTE mismatch.

Diamond heat spreader 540 is coupled to flange 530 with an electrically conductive material. Diamond heat spreader 540 comprises diamond. In at least one or more embodiments, diamond heat spreader 540 has a first and a second planar surface substantially parallel to each other. Diamond is a non-electrically conductive material. A metal layer is patterned on the major surfaces and side walls of diamond heat spreader 540. The second surface of diamond heat spreader 540 is attached with an electrically conductive material 542 to flange 530. In at least one or more embodiments, the thickness of the electrical conductive bonding material 542 may be kept to a minimum to maximize thermal conductivity and/or minimize electrical resistance. A region 544 illustrates an area of stress near the interfaces due to CTE mismatch between the spreader 540 and flange 530 as the temperature varies. It should be noted that diamond heat spreader 540 is disposed between flange 530 and power transistor 532. Diamond heat spreader 540 acts a stress buffer to reduce stress on power transistor 532 when compared to the prior art above where the device is directly bumped to the flange. For example, flange 530 made of a copper tungsten composite has a CTE of 7 ppm/C. Pure copper has a CTE of 17 ppm/C as a reference. Diamond heat spreader 540 has a CTE of 2 ppm/C. Thus, diamond heat spreader 540 buffers power transistor 532 from the largest CTE mismatch in the partial package.

Stress in diamond heat spreader 540 may be reduced further by the selection of bonding material. In general, diamond heat spreader 540 is attached to flange 530 with a metal, solder, a conductive adhesive (e.g., conductive epoxy), or other suitable material. In at least one exemplary embodiment, the patterned metal layer on the diamond heat spreader 540 comprises gold. A gold-germanium metal preform can be used to attach the second surface of the spreader 540 to flange 530. The use of gold metal in the bonding process may produce the highest stress in diamond heat spreader 540 when compared to solder or a conductive epoxy but may yield the lowest thermal and electrical resistance. Conductive epoxy may yield the lowest stress with solder between the two in terms of stress. Conversely, conductive epoxy may yield the highest thermal and electrical resistance. In general, conductive epoxy and solder are softer materials which may reduce stress by also acting as a further stress buffer.

Power transistor 532 has at least two electrically isolated bumped connections to diamond heat spreader 540. In at least one or more non-limiting embodiments, power transistor 532 has a first surface having a gate contact region and a source contact region. A second surface of power transistor 532 is a drain contact region. The first surface includes the active area of power transistor 532. In at least one or more embodiments, bump 534 and bump 536 are a hard bump that comprises gold. A hard bump may comprise a bump that does not substantially change shape after it has been formed. Bumps 534 and 536 are formed respectively on the source contact region and the gate contact region of power transistor 532 and having the same height. In at least one or more embodiments, bumps 534 and 536 have a tin layer on the exposed end for connecting to the metal layer on diamond heat spreader 540. In a thermal process, the tin is absorbed into the gold forming a gold-tin alloy that respectively bonds bumps 534 and 536 to a source contact region and gate contact region on diamond heat spreader 540. Bumps 534 and 536 suspend power transistor 532 above diamond heat spreader 540 by the height of the bump. The minimum bump height may prevent arch over (electric arching) from occurring due to the high voltage potential difference at the periphery of the die drain region to the surface of diamond heat spreader 540.

A stress region 538 is indicated in proximity to the bump contact regions on power transistor 532 and diamond heat spreader 540. Unlike other packages such as disclosed above where the bumps contacted different material surfaces, both bump 534 and bump 536 connect to a common planar surface of diamond heat spreader 540. Thus, a reliable connection can be made and the CTE mismatch between power transistor 532 and diamond heat spreader 540 is constant. In at least one or more embodiments, power transistor 532 is a silicon power transistor. Other types of power transistor materials such as GaAs, GaN, SiC, and so on, are also contemplated. Silicon has a CTE of 3 ppm/C. Diamond has a CTE of 2 ppm/C. The low CTE mismatch between diamond and silicon minimizes stress issues in the package design. Simulation results show greater than 30% reduction in stress when compared to the other example. The assembly of the partial package is also greatly simplified. Diamond heat spreader 540 is mounted to flange 530. The bumped power transistor 532 is then bonded to diamond heat spreader 540. An underfill can be used to fill the voids between power transistor 532 and diamond heat spreader 540 that would also reduce stress. Underfill would have the undesired affect of adding parasitic capacitance. Further stress reduction can be achieved using a soft gold or gold softening process step for bumps 534 and 536.

Figure 6:
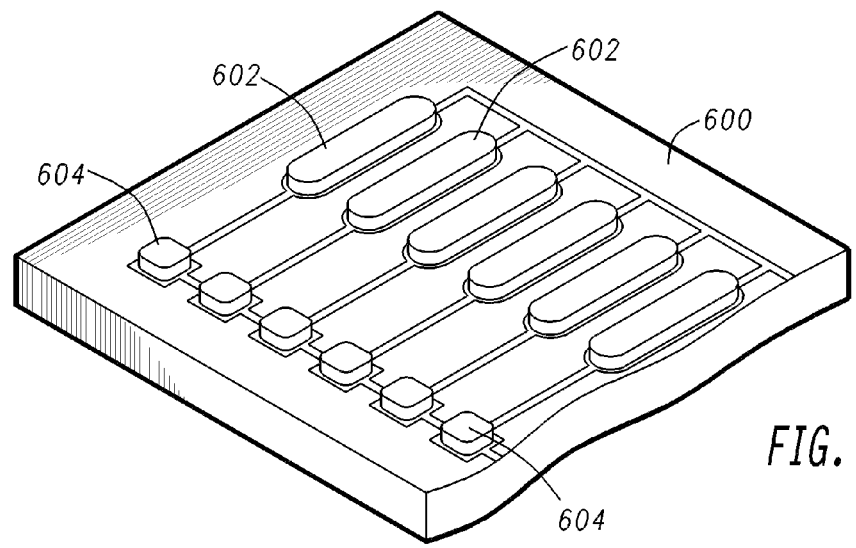
FIG. 6 is an illustration of hard bumps for electrically and thermally coupling a transistor die to a substrate in accordance with one or more embodiments.

FIG. 6 is an illustration of bumps formed on a transistor die 600 in accordance with one or more embodiments. In at least one exemplary embodiment, source bumps 602 and gate bumps 604 are formed on the processed side of transistor die 600. In other words, the power transistor is formed on the surface of the side with source bumps 602 for providing the shortest possible thermal path from die 600. Multiple source and gate bumps are shown in this example. In at least one or more embodiments, the active area of the power transistor underlies each source bump 602. The power transistors are coupled in parallel upon connection to the diamond heat spreader forming a larger transistor. The separation is used to maximize the thermal response of the active area from the device thereby allowing a highly dense transistor cell packing structure for the power transistor to be used.

In at least one exemplary embodiment, gate bumps 604 do not overlie active area of the power transistor. Gate bumps 604 are spaced a predetermined distance away from source bumps 602 that allow reliable connection to the diamond heat spreader. In at least one or more embodiment, photoresist is used to pattern the surface of die 600 exposing the gate and source contact regions. Metal or other electrically/thermally conductive material is plated or deposited in the exposed areas to form the hard bump. The hard bumps do not change substantially in height or shape after being formed or processed through subsequent manufacturing processes. In at least one or more embodiments, bumps 602 and 604 comprise copper and/or gold which provide sufficient electrical and thermal conductive properties.

Figure 7A:
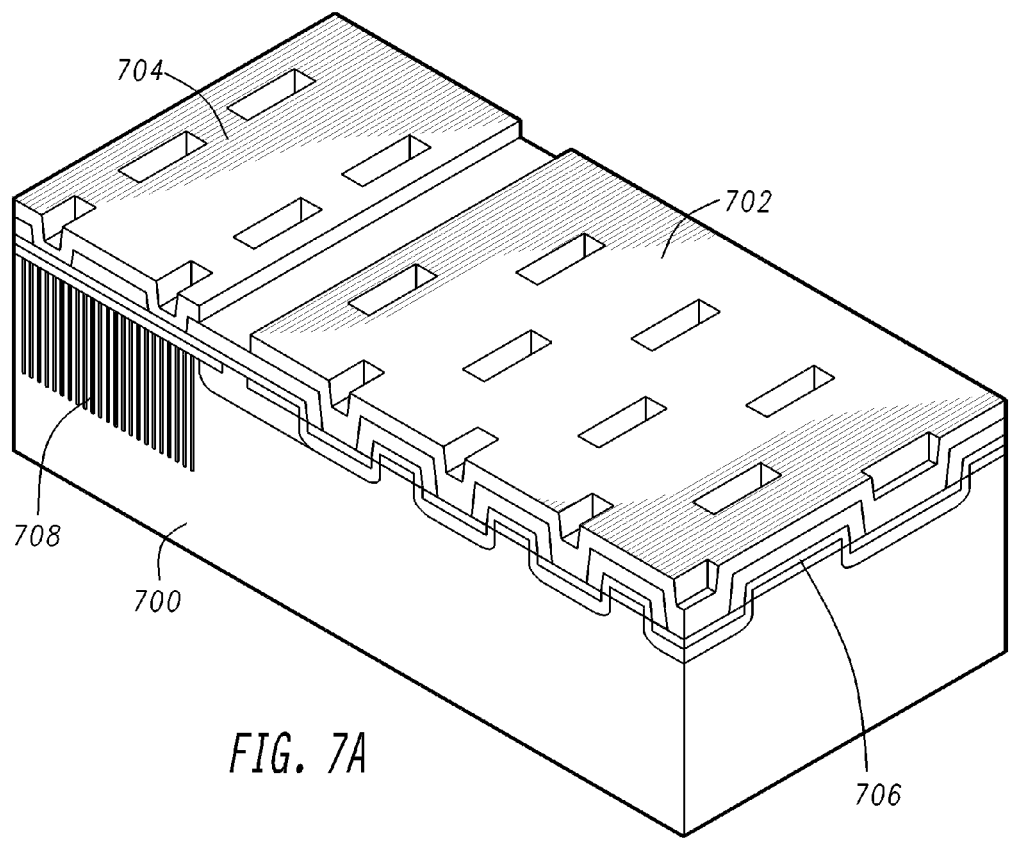
FIG. 7A is a cross-sectional view of a high frequency power transistor in accordance with one or more embodiments.

FIG. 7A is a cross-sectional view of a high frequency power transistor in accordance with one or more embodiments. In general, the high frequency power transistor is a highly dense structure characterized by having a large gate width/length ratio per unit area. In at least one exemplary embodiment, the high frequency power transistor improves device density by having a common drain region. In particular, substrate 700 is a common drain to a group of transistor cells known as a mesh transistor array. The gates of each transistor cell are coupled in common by a polysilicon layer that is silicided for low resistance. Gate contact region 704 connects to the polysilicon layer.

The sources of one or more of the transistor cells are coupled in common by source contact region 702. In at least one exemplary embodiment, source contact region 702 is a metal layer that contacts the doped source region of the substrate. Source contact region 702 overlies the active area of the transistor as shown. This provides the shortest or nearly shortest thermal path for removing heat from the device. In general, source contact region 702 overlies at least a majority of the active area to ensure proximity to where the heat is generated. Current flows laterally through the source and channel region but flows in the vertical direction in the drain region thereby minimizing the distance between adjacent transistor cells.

In at least one or more embodiments, gate contact region 704 does not overlie the transistor active area. Region 704 overlies a dielectric platform 708 for reducing gate to drain capacitance. Dielectric platform 708 is a dielectric region between the gate contact region 704 and substrate 700 which is the drain of the power transistor. Interconnect such as polysilicon, metal, and/or polysilicide is used to connect the gates of the transistor cells to gate contact region 704. In at least one exemplary embodiment, dielectric platform 708 also bounds the active area to terminate field lines such that planar breakdown occurs to minimize device on-resistance.

Figure 7B:
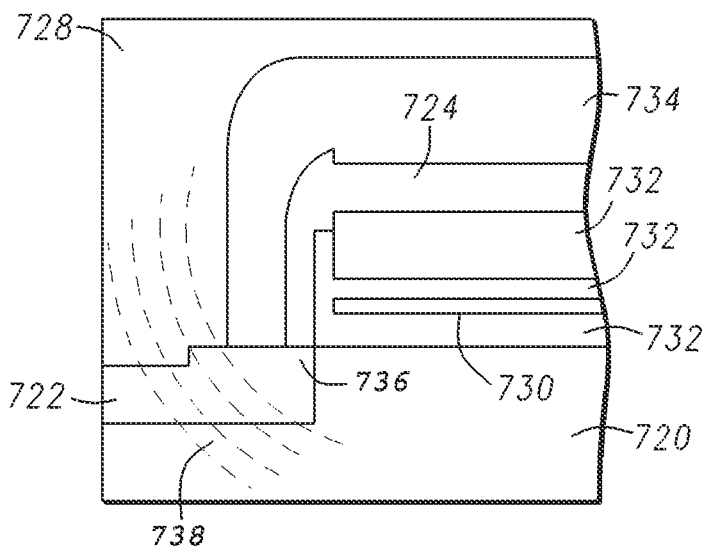
FIG. 7B is a partial cross-sectional view of a transistor cell of the high frequency power transistor of 7A in accordance with one or more embodiments.

FIG. 7B is an exploded view of a transistor cell of the high frequency power transistor of 7A in accordance with one or more embodiments. In at least one or more embodiments, the transistor cell is a pedestal transistor. The pedestal comprises a conductive shield layer 730 isolated from other conductive regions by one or more dielectric layers 732. Shield layer 730 acts as a faraday shield to reduce gate to drain capacitance thereby extending frequency performance. The pedestal overlies drain region 720 of the transistor.

Polysilicon 724 comprises the gate and gate interconnects of the transistor cell. The vertical portion of polysilicon 724 is a gate of the transistor cell and overlies a channel region 736 of a body region 722. A dielectric region (gate oxide) isolates the gate from the channel region 724. The horizontal portion of polysilicon 724 couples to the gate of the adjacent transistor cell. Polysilicon 724 can be silicided to reduce resistance of the layer. A dielectric layer 734 overlies polysilicon 724.

Source contact region 728 is metal that contacts source 726 of the transistor cell and body region 722. As shown, metal of source contact region extends vertically to contact a predetermined area of the semiconductor material in the source region of the device. Current flows laterally from source 726 through channel region 736 and into drain region 720. Current in drain region 720 then flows vertically through the die to be output from a contact coupled to the backside of the die.

Heat generated in drain region 720 is removed through source contact region 728. Dashed lines 738 approximate a path for heat being generated in the substrate to be removed through the source bump, diamond heat spreader, package flange, and/or heat sink. Note that metal from source contact region 728 is less than a few microns from the drain area where heat is being generated. The thermal conductivity of silicon is 140 W/(m*C) whereas the thermal conductivity of aluminum, a common semiconductor interconnect metal or aluminum alloy, is approximately 250 W/(m*C) and therefore may be a better thermal conductor. Thus, the thermal path within the semiconductor substrate may be reduced from mils (thickness of the substrate) in the case where heat is pulled from the back side of the die to microns thereby substantially enhancing the transient thermal response. The amount of source contact region 728 physically contacting the semiconductor substrate for removing heat is a minority portion of the total active area. In at least one or more embodiments, source contact region 728 contacts 25% or less of the total active area allowing for a very dense structure to be used while effectively removing heat from the die.

Figure 8:
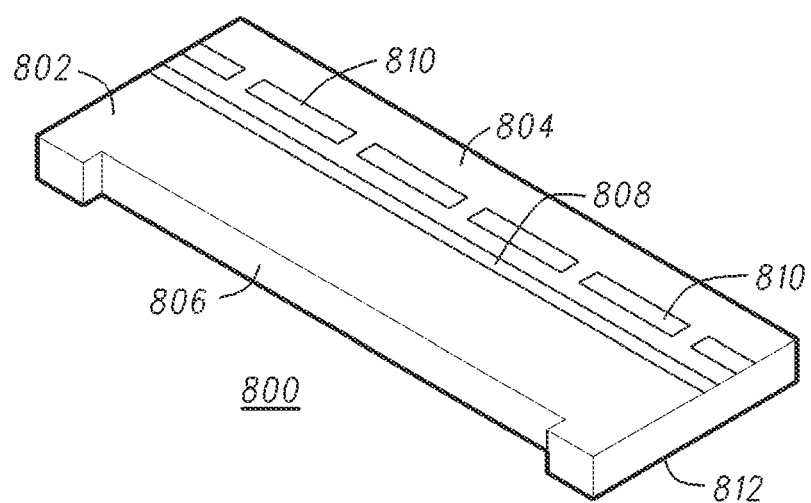
FIG. 8 is an illustration of a diamond heat spreader in accordance with one or more embodiments.

FIG. 8 is an illustration of a diamond heat spreader 800 in accordance with one or more embodiments. Diamond heat spreader 800 has a first surface that couples to a power transistor die and a second surface (not shown) for coupling to a flange of a package. An electrically conductive layer is patterned and formed on diamond heat spreader 800. In at least one exemplary embodiment, a metal composite comprising layers of titanium, platinum, and gold is formed. The titanium is formed on diamond heat spreader which adheres to the diamond surface followed by platinum and finally gold.

Two separate electrically conductive regions are formed on the first surface. The first is source contact region 802. A second is gate contact region 804. An exposed diamond region 808 separates source contact region 802 from gate contact region 804. Exposed diamond regions 810 in gate contact region 804 reduce parasitic capacitance due to coupling to the die as disclosed hereinabove. A metal layer 806 overlies a sidewall of diamond heat spreader 800 that connects to source contact region 802—to a source contact region 812 overlying the second surface of diamond heat spreader 800. Source contact region 812 couples to the flange of the package. The sidewall (not shown) opposing metal layer 806 is not metalized for being an electrical conductive path. Similarly, the two remaining sidewalls are also not metalized.

Figure 9:
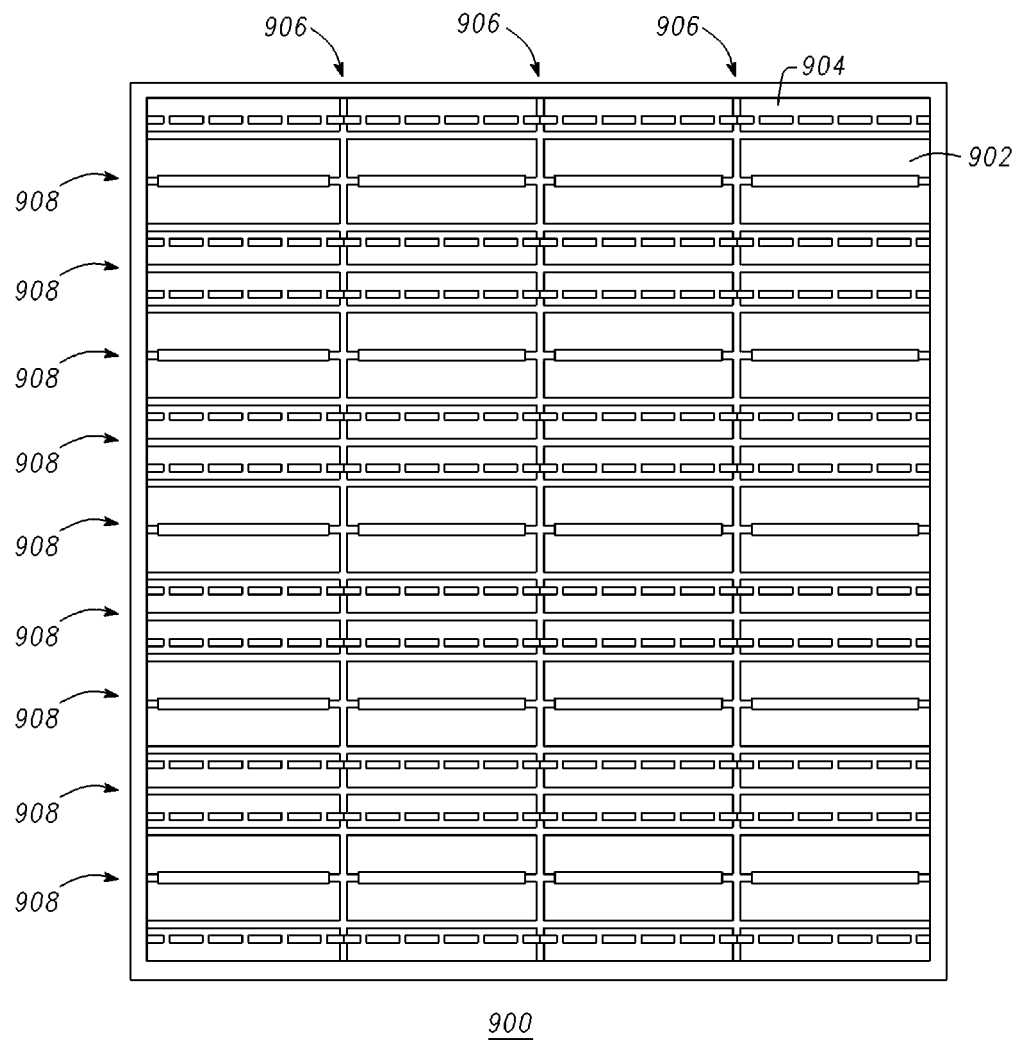
FIG. 9 is an illustration of an array of diamond heat spreaders in accordance with one or more embodiments.

FIG. 9 is an illustration of an array 900 of diamond heat spreaders in accordance with one or more embodiments. Forty diamond heat spreaders are shown in a 4×10 array. As shown, array 900 has a patterned electrically conductive surface. A gate contact region 904 and a source contact region 902 are indicated in a non-limiting example. In general, the diamond heat spreader is patterned with one or more contact regions on each major surface. Each diamond heat spreader may be identically tiled in a row. In a column adjacent diamond heat spreaders are tiled as mirror images. Array 900 is sawn having 3 cuts vertically as indicated by arrows 906. Electrically conductive material does not overlie the area where the cuts are made. Array is sawn having 9 cuts horizontally as indicated by arrows 908. The cuts separate array 900 into 40 separate diamond heat spreaders very efficiently with little waste material thereby keeping cost to a minimum.

Figure 10A:
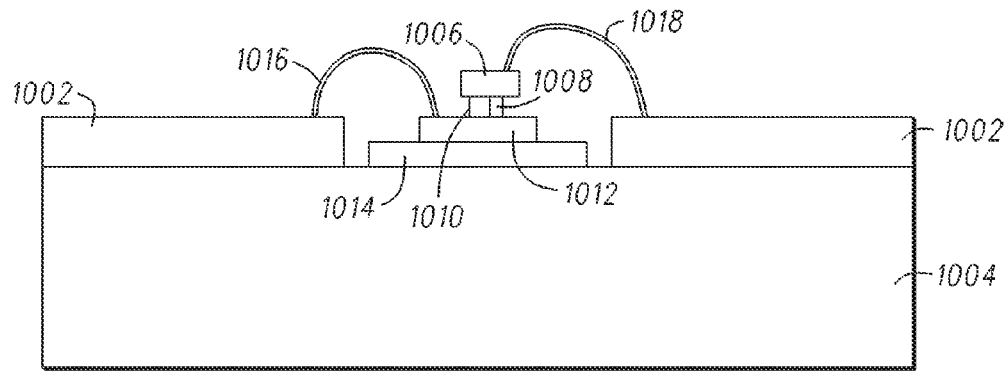
FIGS. 10A-10B are illustrations of a power transistor die 1006 mounted to a printed circuit board in accordance with one or more embodiments.
Figure 10B:
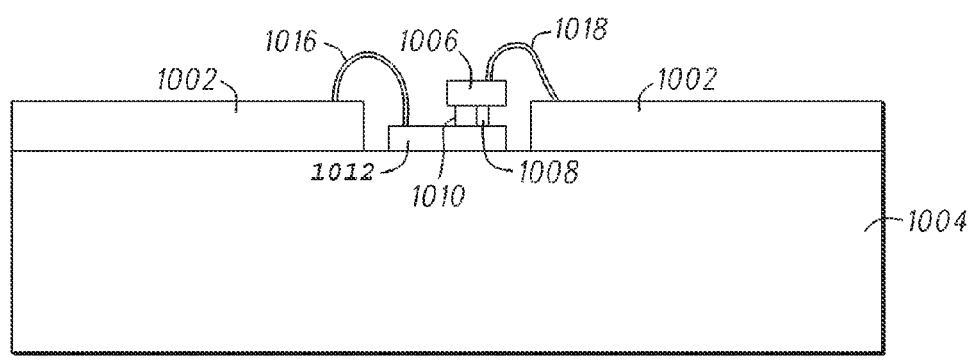

FIGS. 10A-10B are illustrations of a power transistor die 1006 mounted to a printed circuit board in accordance with one or more embodiments. A printed circuit board 1002 is coupled to a heat sink 1004 for removing heat from power transistor die 1006. The layout allows other circuits and device to be interconnected to one or more power transistor die to form a larger circuit while having a path for removing heat from the high power die. Areas of printed circuit board 1002 are cut out forming an opening to expose heat sink 1004.

Power transistor die 1006 is connected to a diamond heat spreader 1012 using one or more hard bumps. The hard bumps are electrically and thermally conductive. Referring to FIG. 10A, diamond heat spreader 1012 is coupled to a flange 1014. Flange 1014 is placed through the opening formed in printed circuit board 1002 and attached to heat sink 1004. Thus, an efficient thermal path is formed as described above for removing heat from a high frequency high power transistor. In at least one exemplary embodiment, wire bonds 1016 and 1018 respectively couples the gate of the power transistor to a contact point on printed circuit board 1002 and couples the drain of the power transistor to a contact point on printed circuit board 1002. In at least one exemplary embodiment, the source of the power transistor is coupled to printed circuit board through heat sink 1004 or other electrically conductive path. Referring to FIG. 10B, diamond heat spreader 1012 is directly attached to heat sink 1004 thereby eliminating flange 1014.

While the claimed subject matter has been described with reference to exemplary embodiments, it is to be understood that the claimed subject matter is not limited to the disclosed exemplary embodiments. The scope of the following claims is to be accorded the broadest interpretation so as to encompass all modifications, equivalent structures and functions of the relevant exemplary embodiments. For example, although numbers may be quoted in the claims, it is intended that a number close to the one stated is also within the intended scope, i.e., any stated number should be interpreted to be "about" the value of the stated number. Thus, the description of the claimed subject matter is merely exemplary in nature and, thus, variations that do not depart from the gist of the claimed subject matter are intended to be within the scope of the claimed subject matter. Such variations are not to be regarded as a departure from the spirit and scope of the claimed subject matter.

What is claimed is:

1. A semiconductor device, comprising:
    a semiconductor die having a heat region disposed on at least one portion of the semiconductor die, the semiconductor die comprising a source contact region and a gate contact region;
    a diamond substrate disposed proximate to the semiconductor die; and
    an electrically conductive layer formed and patterned on the diamond substrate, wherein the electrically conductive layer comprises two regions physically separate from one another via a gap between the two regions and having one or more openings, in addition to the gap, formed in the region coupled to the gate region of the semiconductor die and wherein the diamond substrate is capable of dissipating heat from the diamond substrate via at least one or more bumps coupling the diamond substrate to the heat region of the semiconductor die;
    wherein a thickness of the diamond substrate is selected to meet a thermal specification of the semiconductor die.

2. The semiconductor device of claim 1, wherein at least one or more additional bumps electrically couple the diamond substrate to a contact region of the semiconductor device at a location outside of the heat region.

3. The semiconductor device of claim 1, wherein at least one or more vias electrically couple the diamond substrate to a contact region of the semiconductor device at a location outside of the heat region.

4. The semiconductor device of claim 1, wherein the semiconductor die comprises at least one or more contact regions, the contact regions comprising an electrically conductive adhesion layer for adhering to the diamond substrate, an electrically conductive barrier layer, or an electrically conductive layer for physically coupling to the at least one or more bumps, or combinations thereof.

5. The semiconductor device of claim 1, wherein at least one or more of the bumps comprise gold.

6. The semiconductor device of claim 1, wherein at least one or more of the bumps comprise copper.

7. The semiconductor device of claim 1, wherein the diamond substrate is separated from the semiconductor die by a distance sufficient to reduce or prevent arch over at a selected operating voltage.

8. The semiconductor device of claim 1, the semiconductor die comprising at least one transistor disposed in the heat region and having a channel region, wherein a portion of the diamond substrate contacts the channel region of the die within about a few microns from the channel region of the transistor to reduce heat flow through the transistor.

9. The semiconductor device of claim 1, wherein the semiconductor die comprises two or more mesh transistor cells, one or more of the mesh transistor cells comprising a metal heat dissipation region coupled to the diamond substrate.

10. The semiconductor device of claim 1, wherein the semiconductor die comprises a dielectric platform region disposed adjacent to at least a portion of the heat region.

11. The semiconductor device of claim 1, wherein the diamond substrate is capable of at least partially reducing stress on the semiconductor die.

12. The semiconductor device of claim 1, further comprising a flange coupled to the diamond substrate to dissipate heat from the heat region of the semiconductor die to a heat sink via the diamond substrate and the flange.

13. The semiconductor device of claim 1, further comprising a flange coupled to the diamond substrate to dissipate heat from the heat region of the semiconductor die to a heat sink via the diamond substrate and the flange, wherein the diamond substrate is coupled to the flange via a gold-germanium layer, a solder layer, or a conductive epoxy layer, or combinations thereof.

14. The semiconductor device of claim 1, further comprising:
    a printed circuit board; and
    a heat sink coupled to the circuit board;
    wherein the diamond substrate is coupled to the heat sink and wherein the semiconductor die is coupled to the printed circuit board.

15. The semiconductor device of claim 1, further comprising:
    a printed circuit board;

a heat sink coupled to the circuit board, wherein the diamond substrate is coupled to the heat sink; and a shielding cap at least partially covering the semiconductor die and being coupled to the printed circuit board.

* * * * *